United States Patent
Wilson et al.

(10) Patent No.: US 8,335,879 B2
(45) Date of Patent: Dec. 18, 2012

(54) NODE DIFFERENTIATION IN MULTI-NODE ELECTRONIC SYSTEMS

(75) Inventors: Larry E Wilson, Tomball, TX (US); Hank Dao, Cypress, TX (US); Vi T Lu, Houston, TX (US); Adnan T Gunduz, Cypress, TX (US); John D Nguyen, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 145 days.

(21) Appl. No.: 12/770,132

(22) Filed: Apr. 29, 2010

(65) Prior Publication Data

US 2011/0271020 A1 Nov. 3, 2011

(51) Int. Cl.
*G06F 13/00* (2006.01)
*G06F 3/00* (2006.01)
*H05K 7/10* (2006.01)

(52) U.S. Cl. ............... 710/104; 710/9; 710/15; 710/301
(58) Field of Classification Search ............... 710/9, 15, 710/301, 104
See application file for complete search history.

(56) References Cited

U.S. PATENT DOCUMENTS

| | | | | |
|---|---|---|---|---|
| 5,259,794 A * | 11/1993 | Lee | ............................... | 439/751 |
| 5,371,897 A * | 12/1994 | Brown et al. | ................... | 709/222 |
| 5,511,223 A * | 4/1996 | Scecina et al. | ................... | 714/36 |
| 5,522,042 A * | 5/1996 | Fee et al. | ........................ | 709/226 |
| 5,664,221 A * | 9/1997 | Amberg et al. | .................... | 710/9 |
| 5,740,464 A * | 4/1998 | Priem et al. | ........................ | 710/3 |
| 5,831,546 A * | 11/1998 | Costa et al. | ................... | 340/9.16 |
| 5,928,343 A * | 7/1999 | Farmwald et al. | ............. | 710/104 |
| 6,055,582 A * | 4/2000 | Pascarella et al. | ............... | 710/14 |
| 6,101,559 A * | 8/2000 | Schultz et al. | .................... | 710/15 |
| 6,112,271 A * | 8/2000 | Lanus et al. | ..................... | 710/306 |
| 6,427,176 B1 * | 7/2002 | Berglund et al. | .................. | 710/8 |
| 6,438,625 B1 * | 8/2002 | Olson | ............................... | 710/9 |
| 6,785,725 B1 * | 8/2004 | Ramanan | ....................... | 709/227 |
| 6,870,840 B1 * | 3/2005 | Hill et al. | ....................... | 370/389 |
| 7,139,839 B2 * | 11/2006 | White et al. | ................... | 709/245 |
| 7,830,272 B2 * | 11/2010 | Thurmond et al. | ....... | 340/870.02 |
| 7,945,702 B1 * | 5/2011 | Son et al. | .......................... | 710/3 |
| 2002/0095515 A1 * | 7/2002 | Christensen et al. | ......... | 709/245 |
| 2003/0028687 A1 * | 2/2003 | Goossen et al. | ................... | 710/1 |
| 2004/0075533 A1 * | 4/2004 | Ives et al. | ..................... | 340/5.73 |
| 2006/0253472 A1 * | 11/2006 | Wasserman et al. | .......... | 707/100 |

(Continued)

FOREIGN PATENT DOCUMENTS

| | | | |
|---|---|---|---|
| EP | 930573 A2 | * | 7/1999 |
| JP | 01055898 A | * | 3/1989 |
| JP | 02148107 A | * | 6/1990 |
| JP | 05204844 A | * | 8/1993 |
| JP | 2009017069 A | * | 1/2009 |

OTHER PUBLICATIONS

"NNRD450119: Automatically Configuring a Server Blade Environment Using Positional Deployment", Oct. 1, 2001, IBM, IBM Technical Disclosure Bulletin, Iss. 450, p. 1759.*

(Continued)

*Primary Examiner* — Faisal M Zaman (57) ABSTRACT

A technique for differentiating nodes in a multi-node electronic system includes establishing an intended configuration for the system, the configuration including a number of nodes to be installed and a specification of intended node locations. A node ID for each of multiple nodes to be installed in the system is established, and the multiple nodes are installed. Using the node ID established for each of the multiple nodes, a determination is made whether the multiple nodes as installed comply with the intended configuration.

15 Claims, 6 Drawing Sheets

U.S. PATENT DOCUMENTS

| | | | |
|---|---|---|---|
| 2007/0006056 A1* | 1/2007 | Lehner et al. | 714/727 |
| 2007/0109150 A1* | 5/2007 | Gershfeld et al. | 341/22 |
| 2008/0155074 A1* | 6/2008 | Bacinschi | 709/222 |
| 2008/0189449 A1* | 8/2008 | Souders et al. | 710/18 |
| 2009/0177877 A1* | 7/2009 | Holdaway et al. | 713/2 |

OTHER PUBLICATIONS

"NN86091494: Extending the Addressing Capabilities of the IBM Series/1 to 32 Bits", Sep. 1, 1986, IBM, IBM Technical Disclosure Bulletin, vol. 29, Iss. 4, pp. 1494-1501.*

Mutnury, B.; Pham, N.; Cases, M.; De Araujo, D.N.; Pitner, G.; , "Design issues in telecommunication blade systems and their resolution through design of experiments," Electronic Components and Technology Conference, 2009. ECTC 2009. 59th , pp. 1887-1893, May 26-29, 2009.*

Suffern, E.; Strole, N.; , "Design considerations for high-speed internetworking among compute blades within a blade server chassis," Local Computer Networks, 2003. LCN '03. Proceedings. 28th Annual IEEE International Conference on , pp. 642-643, Oct. 20-24, 2003.*

* cited by examiner

NODE DIFFERENTIATION IN MULTI-NODE ELECTRONIC SYSTEMS

BACKGROUND

Electronic systems such as server computers often include multiple processing units called nodes. A node typically includes a main circuit board known as a motherboard that hosts one or more central processing units and some associated memory. Each node in a server computer system may be connected via cables to one or more data storage devices such as hard disk drives, optical disk drives and the like. While a node may be connected to multiple data storage devices, generally a data storage device is connected to only one node.

To ensure compliance with a desired configuration for a given server system, it is important that the correct data storage devices be connected to the intended nodes. If this is not the case, then the result is a cabling error. Cabling errors arising from installation or maintenance activities can cause a variety of serious problems including malfunction or nonfunction of the server system.

It is also important that power supplies and cooling systems that are intended to be associated with certain nodes actually be so associated when a server system is installed and maintained. If this does not occur, problems such as overheating and power supply overload can result.

DETAILED DESCRIPTION

Figure 1:
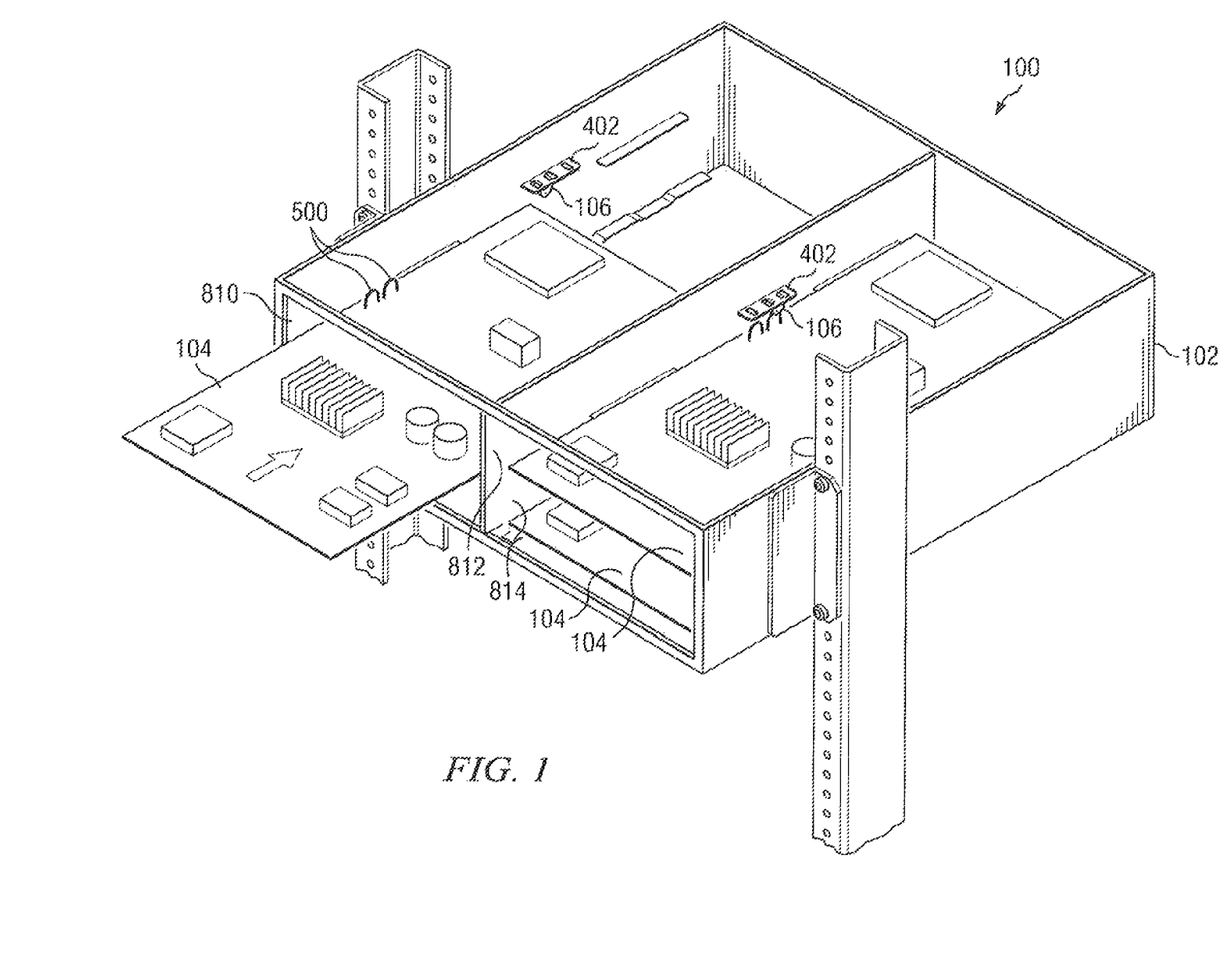
FIG. 1 is an oblique view illustrating a multi-node electronic system in accordance with an example embodiment of the invention.

FIG. 1 presents a multi-node electronic system 100 according to an example embodiment of the invention. System 100 includes a chassis 102 configured to receive multiple nodes 104 therein. In one example class of embodiments, the system may be a server computer system and the nodes may be motherboards hosting computing devices and memory. Other electronic systems may also benefit from the same techniques to be described here. Each of nodes 104 is configured to be installed in chassis 102, for example by sliding into chassis 102 as indicated in the drawing.

Figure 2:
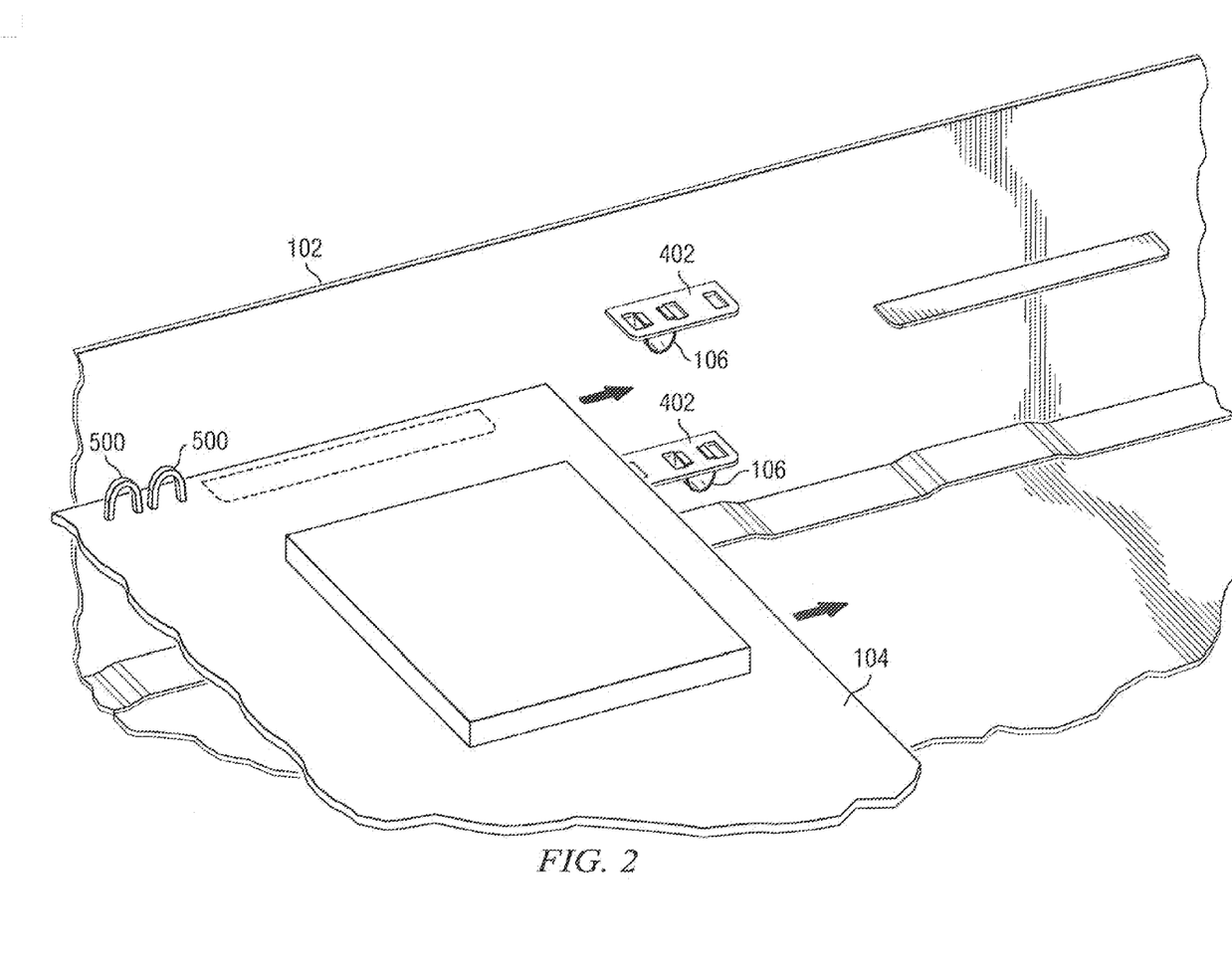
FIG. 2 is a cutaway close-up view illustrating the system of FIG. 1 in more detail.

FIG. 2 provides a close-up view of one of nodes 104 sliding into chassis 102. As can be seen in the drawings, one or more resilient conductors 106 may be disposed either on nodes 104 or on chassis 106. Conductors 106 are configured to establish a different node identification value for each of nodes 104 by either making or not making electrical connections between circuitry on nodes 104 and circuitry on chassis 102 when the nodes are inserted therein.

Figure 3:
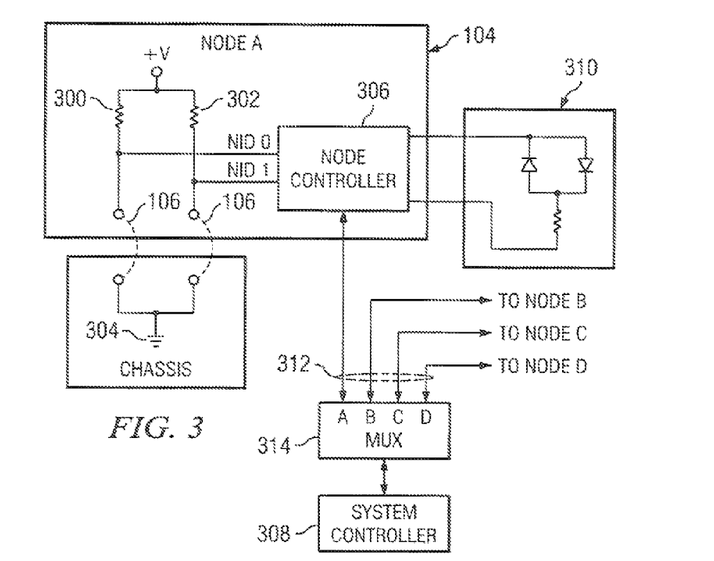
FIG. 3 is a schematic diagram illustrating the multi-node system of FIG. 1 in accordance with an example embodiment of the invention.

Electrically, this can be seen in FIG. 3. Pull-up resistors 300, 302 on the nodes can either be connected to chassis ground 304 or not, depending on whether one of the resilient conductors 106 is present. Thus, together, the pull-up resistors 300, 302 and chassis ground 304 form node identification circuitry capable of differentiating the several nodes from one another by maintaining different voltage values. If a conductor 106 is present so that resistor 302 is connected to chassis ground 304, then node ID signal NID1 is pulled low. If not, signal NID1 is pulled high. Similarly, if a conductor 106 is present so that resistor 300 is connected to chassis ground 304, then signal NID0 is pulled low, else it is pulled high. In this manner each node may be given a unique binary identification value by installing conductors 106 at various different locations appropriately so that the electrical connections made or not made by conductors 106 will represent a one or zero for each digit of the binary identification value. In systems with two nodes, a single digit suffices for this purpose. In the illustrated embodiment, there are four nodes, so two digits are used. In other embodiments, more nodes may be used and a suitably larger number of digits employed to differentiate the nodes.

A node controller 306 may take signals NID0 and NID1 as inputs and report the resulting binary node identification value to a system controller 308. System controller 308 can then determine whether an expected node identification value has been reported by a given node 104, and can reply to the node with an appropriate response. For example, system controller 308 may indicate OK to the node if the node reported the expected node identification value, or ERROR if the node reported an unexpected node identification value. Similarly, system controller 308 may make a determination for the entire system whether each of the nodes has reported a unique node identification value. Finally, a visual indication of these determinations may be displayed using a visual indicator 310 such as the light emitting diodes ("LEDs") shown in the drawing. The LEDs may have different colors, for example, so that different states may be indicated using the different colors and/or by flashing them. In the embodiment shown, the visual indication is given by node controller 306 after it receives its response from system controller 314. In other embodiments, the visual indication may be given by system controller 308.

In some embodiments, as in the embodiment shown, a separate communication bus 312 may be provided for each of the nodes in the system. In this class of embodiments, each node communicates its node identification value to system controller 308 via one of the buses 312. Controller 308 may be configured to expect a specific node identification value on each of buses 312. Any type of bus can be used for this purpose. For example, serial communication buses may be used and may be multiplexed to system controller 308 using a multiplexer 314 as shown.

Figure 4:
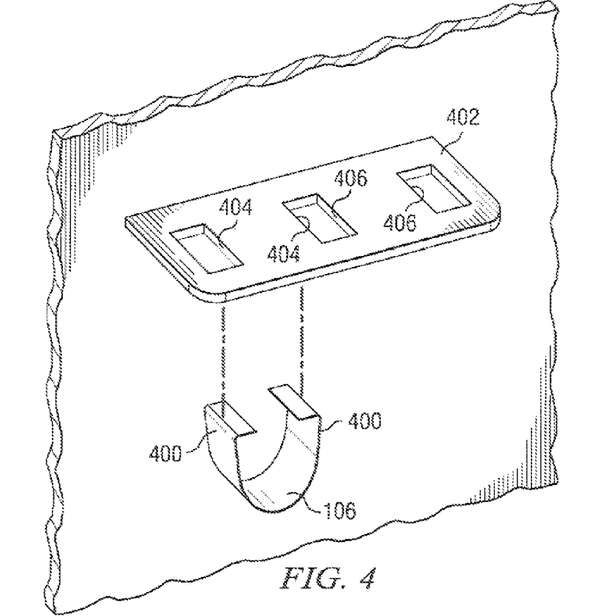
FIG. 4 is a close-up view illustrating the attachment of a resilient conducting clip to a structure in accordance with an example embodiment of the invention.

A variety of techniques may be employed to establish node identification values using conductors 106. In one class of embodiments, this can be done by making the conductors removable so that configuration and reconfiguration is easily achieved. As illustrated in FIG. 4, one way of doing this is to fashion conductor 106 from a resilient metal clip having legs 400. The clip can be attached to a structure 402 at various locations by engaging or urging legs 400 against opposing bearing surfaces 404 or 406. In the embodiment shown, the clip may be installed in two different locations. In other embodiments, more locations may be provided as needed.

Structure 402 may take any suitable form. In the embodiment shown, it is a flange that extends from a wall of chassis 102 over a portion of one of nodes 104. When a node 104 is installed in chassis 102, arcuate conductive surfaces 500 slide under the flange so that arcuate surfaces 500 will engage a clip if one is present. Arcuate conductive surfaces 500 may be connected, for example, to resistors 300 and 302. Flange 402 may itself be conductive so that engagement of surface 500 with conductor 106 will complete a circuit to chassis ground. Thus surfaces 500 and conductors 106 comprise electrical contacts capable of making an electrical connection with one another when brought into proximity as a node 104 is installed in chassis 102.

Figure 5A:
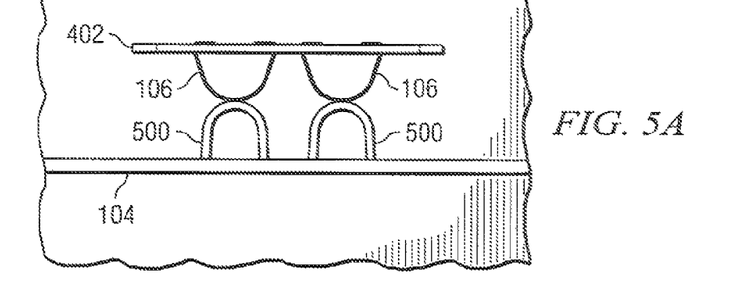
FIGS. 5A-5D are side views of the clip and structure of FIG. 4 shown in various different configurations, each configuration establishing a different node identification value.
Figure 5B:
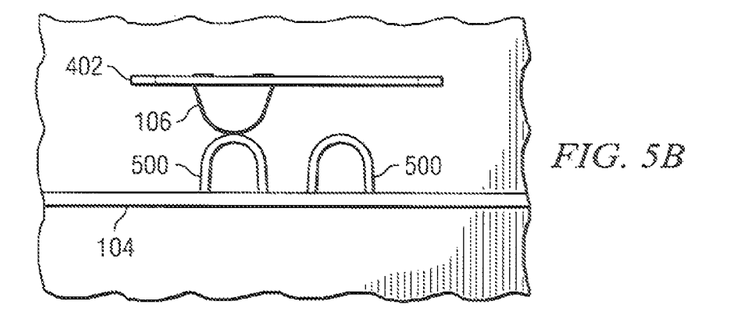
Figure 5C:
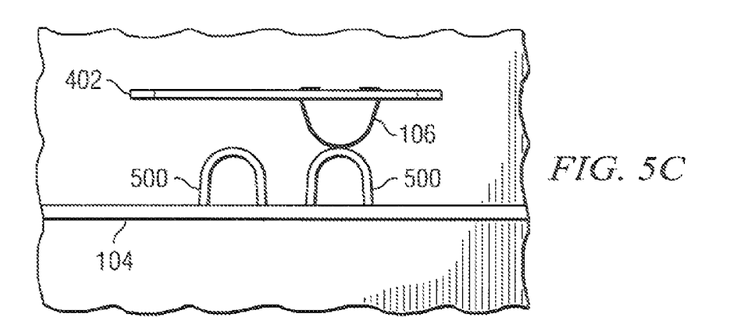
Figure 5D:
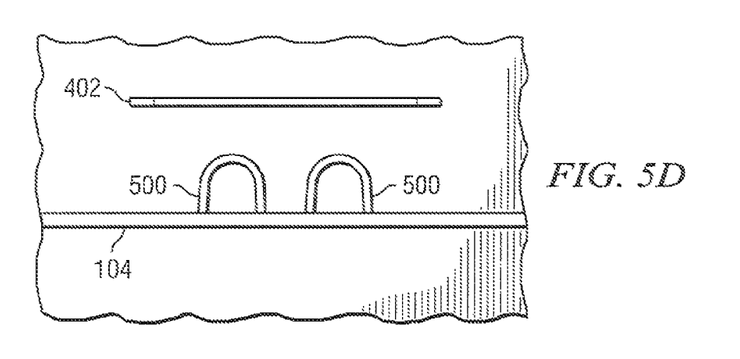
Figure 6:
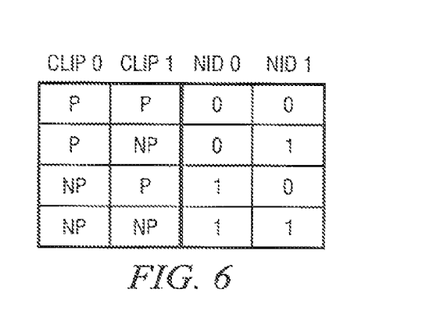
FIG. 6 is a table illustrating the correspondence between the clip configurations of FIG. 5 and the node identification values they establish.

In general, the node identification values can be established by varying the number and location of installed clips. This is illustrated by way of example in FIGS. 5 and 6. When two clips are present ("P") as in FIG. 5A, signals NID0 and NID1 are both pulled low, with the result that a node identification value of 00 is established. When only one clip is installed on the left-hand side as in FIG. 5B and the clip on the right-hand side is not present ("NP"), a node identification value of 01 is established. If one clip is installed on the right-hand side as in FIG. 5C, a node identification value of 10 is established. And if both clips are not present as in FIG. 5D, a node identification value of 11 is established.

Figure 7:
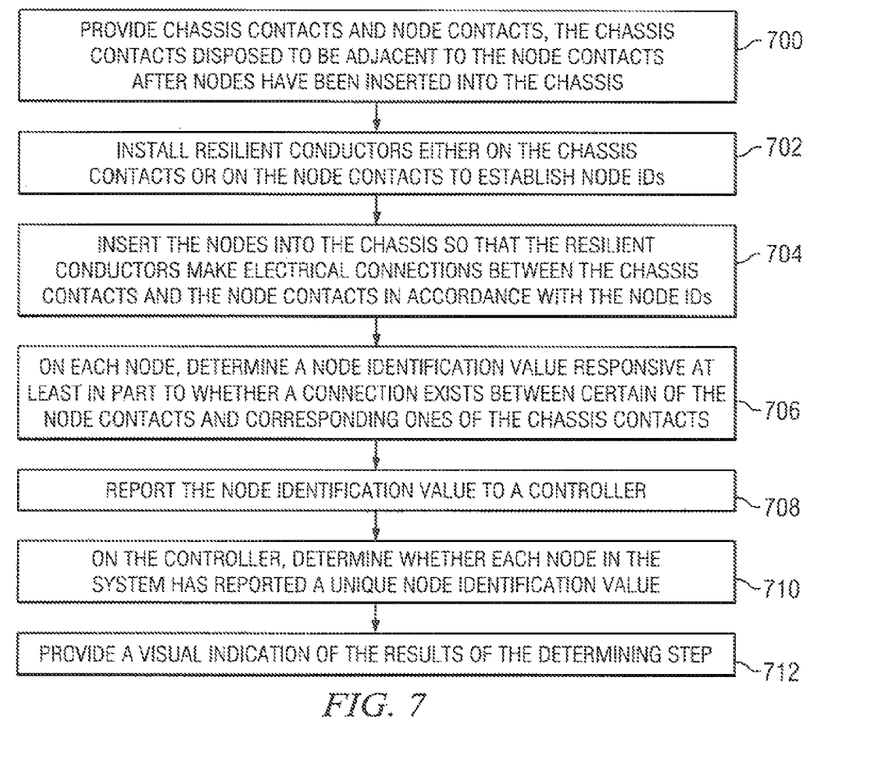
FIG. 7 is a flow diagram illustrating a method of differentiating nodes in a multi-node system in accordance with example embodiments including without limitation those of FIGS. 1-6.

FIG. 7 describes in method terms how the inventive technique may be employed to differentiate nodes in any multi-node electronic system. In step 700, chassis contacts and node contacts are provided and are disposed to be adjacent to one another after the nodes have been inserted into the chassis. In step 702, resilient conductors are installed either on the chassis or on the nodes to establish appropriate node identification values for each node. In step 704, the nodes are inserted into the chassis so that electrical connections are made between the chassis contacts and the node contacts in accordance with the node identification values established in step 702. Then in step 706, on each node, a node controller determines the node identification value for that node, responsive at least in part to the voltages maintained by the electrical contacts so made. The node controller then reports this value to a system controller in step 708. In step 710, the system controller can either determine whether the given node has reported an expected value, or it may determine whether all of the nodes have reported unique values, or both. Finally, in step 712, a visual indication of the determining step outcome is provided.

The inventive technique is not limited just to the classes of electro-mechanical implementations generally described above. Instead, persons having ordinary skill in the art and having reference to this specification will appreciate that a variety of means may be employed to identify each node in a multi-node electronic system, to verify that particular nodes have been installed in their intended locations in accordance with a configuration plan, and/or to verify that particular nodes are present.

Figure 8:
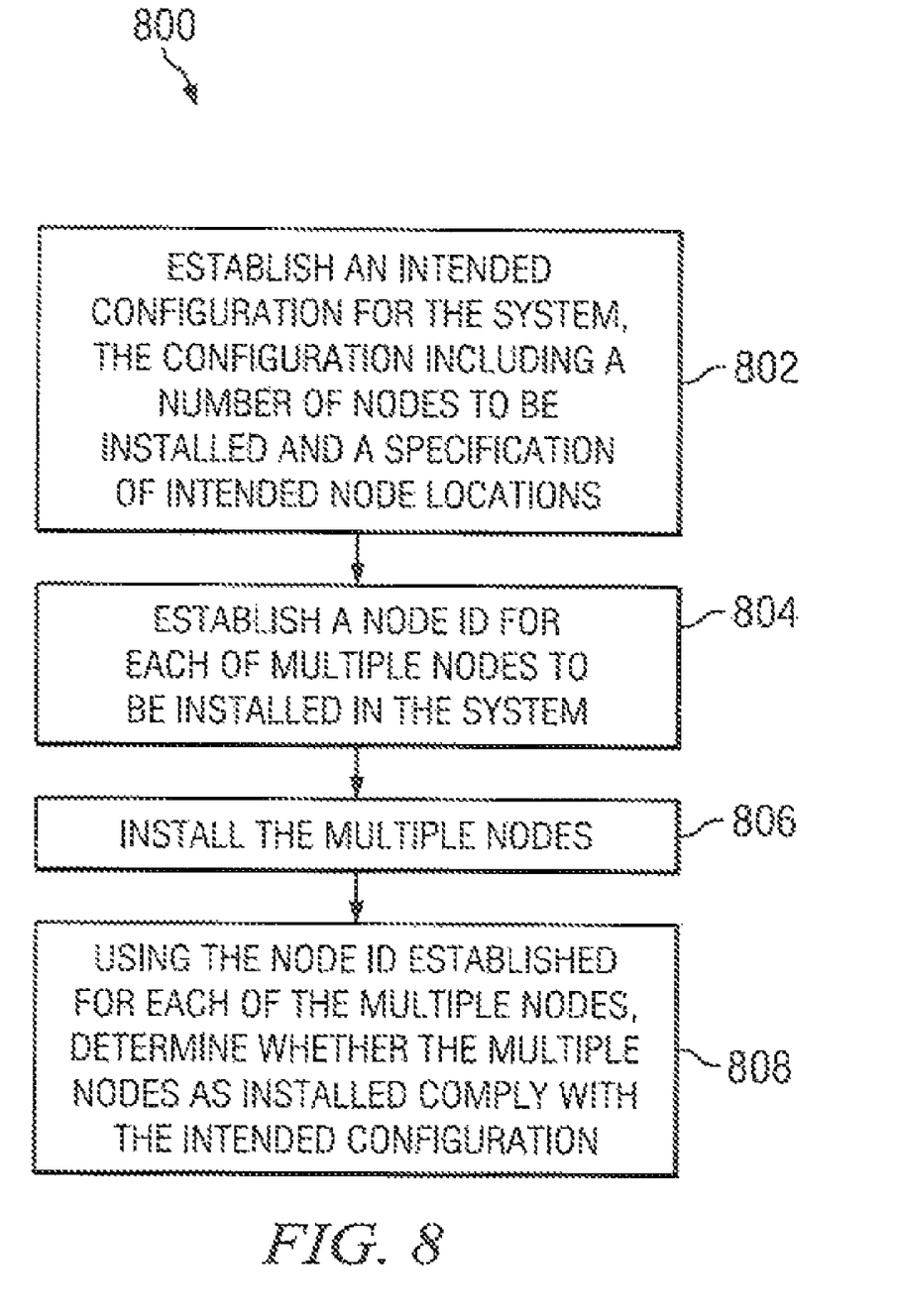
FIG. 8 is a flow diagram illustrating a general technique for differentiating nodes in a multi-node system in accordance with various embodiments of the invention.

Accordingly, method 800 shown in FIG. 8 illustrates a general technique for differentiating nodes in a multi-node system in accordance with various embodiments of the invention including without limitation those described by way of example herein. In step 802, an intended configuration is established for the system. The configuration may include parameters such as the number of nodes to be installed in the system and a specification of intended locations in the system for the nodes. For example, in a system such as that shown in FIG. 1, one node may be intended for an upper left bay 810 of chassis 102, another node may be intended for an upper right bay 812 of chassis 102, still another node may be intended for a lower right bay 814 of chassis 102 and so on. In step 804, a node ID is established for each of the multiple nodes to be installed in the system. Each of the node IDs may be unique, and each node ID may be associated with an intended location. The node IDs may be established using any suitable technique, including without limitation any of the electro-mechanical techniques described above, as well as other techniques such as with mechanical switches that respond to installation locations of a node within an enclosure. In step 806, the multiple nodes are installed in the system. In step 808, the node IDs are used to determine whether the multiple nodes as installed comply with the established intended configuration. This determination may be made using any suitable technique, including without limitation the controller technique described above, as well as other techniques such as by using comparator logic located anywhere inside or outside the system. The determination may also be made using software or firmware.

Among the advantages gained using the inventive technique are that cabling errors in multi-node systems may be avoided because the technique makes it possible to ensure that intended nodes are installed in intended locations. Moreover, it is possible to employ the inventive technique using minimal and inexpensive additional components.

While the invention has been described in detail with reference to certain embodiments thereof, the described embodiments have been presented by way of example and not by way of limitation. It will be understood by those skilled in the art and having reference to this specification that various changes may be made in the form and details of the described embodiments without deviating from the spirit and scope of the invention as defined by the appended claims.

What is claimed is:

1. A method of differentiating nodes in a multi-node electronic system, comprising:
   establishing an intended configuration for the system, the configuration including a number of nodes to be installed and a specification of intended node location, the intended configuration being determined before the nodes are installed by a system controller;
   establishing a node ID for each of nodes to be installed in the system;
   installing the nodes, by either making or not making electrical connections between circuitry on the nodes and circuitry on a chassis to establish a unique binary identification value for each of the nodes installed, circuitry on each node to report a unique binary identification value for that node to the controller, the unique binary identification values are formed by varying the locations at which a first and second chassis contact are installed and varying the number of first and second chassis contacts installed, and
   using the node ID established for each of the nodes, determining whether the nodes as installed comply with the intended configuration, in which the controller determines whether each node has reported an expected identifier.

2. The method of claim 1, wherein:
   the system comprises more than two nodes; and
   in which establishing the node ID and installing the multiple nodes comprises forming the unique binary identification value for each of the multiple nodes by making or not making electrical connections so as to represent a one or a zero for each digit of each binary identification value.

3. The method of claim 1, in which establishing the node ID and installing the multiple nodes comprises:
   providing the first and second chassis contacts on a chassis and first and second node contacts on first and second nodes, respectively, the chassis contacts disposed to be adjacent to the node contacts after the first and second nodes have been inserted into the chassis, but disposed not to make electrical connections with the node contacts without more;
   installing a resilient conductor either on the first chassis contact or on the first node contact to create an electrical connection between the first chassis contact and the first node contact; and
   inserting the first and second nodes into the chassis so that the resilient conductor makes an electrical connection between the first chassis contact and the first node contact and so that no electrical connection is made between the second chassis contact and the second node contact.

4. The method of claim 3, further comprising:
   on each node, determining a node identification value responsive at least in part to whether a connection exists between at least one of the node contacts and a corresponding one of the chassis contacts; and
   reporting the node identification value to a controller.

5. The method of claim 4, further comprising:
   on the controller, determining whether each node in the system has reported an expected node identification value; and
   providing a visual indication of the results of determining the node identification value.

6. The method of claim 3, wherein:
   installing the resilient conductor comprises urging legs of a metal clip against two opposing bearing surfaces; and
   inserting the nodes into the chassis comprises sliding a conductive arcuate surface against the clip.

7. An electronic system, comprising:
   a chassis;
   more than two nodes installable in the chassis;
   a number of removable resilient conductors to establish a different node identification value for each of the nodes installed in the chassis by either making or not making electrical connections between circuitry on the nodes and circuitry on the chassis,
      in which the conductors comprise a number of clips installed by engaging legs of the clip with opposing bearing surfaces on a structure to which the conductors are mounted,
      in which the structure defines at least two locations at which the clip may be installed,
      in which the node identification values are formed by varying the locations at which the clips are installed on the structure and varying the number of clips installed;
   a controller; and
   circuitry on each node to report the node identification value for that node to the controller,
   in which the controller determines whether each node has reported an expected identifier.

8. The system of claim 7:
   further comprising an arcuate conductive surface to engage the clip to make an electrical connection between the arcuate conductive surface and the clip.

9. The system of claim 7:
   further comprising one communication bus for each node in the system;
   wherein each node communicates its node identification value to the controller via one of the buses; and
   wherein the controller expects a specific node identification value on each bus.

10. An electronic system, comprising:
    a chassis;
    a number of nodes coupled to the chassis; and
    node identification circuitry to differentiate the nodes from one another by maintaining a plurality of different voltage values, the node identification circuitry comprising:
       a number of sets of electrical contacts coupled to the chassis and disposed adjacent to each of the nodes, respectively, the sets of electrical contacts each comprising a plurality of removable resilient conductors to make an electrical connection between one of the sets of electrical contacts and one of the nodes;
       in which each of the electrical connections between the sets of electrical contacts and the nodes creates one of the different voltage values, and
       in which the electrical connections between the sets of electrical contacts and the nodes each form a unique multi-digit binary number for each node;
    a controller to receive the unique multi-digit binary number;
       wherein the node identification circuitry is disposed on each of the nodes and reports the unique multi-digit binary number to the controller, in which the unique multi-digit binary numbers are formed by varying the locations at which the plurality of removable resilient conductors are installed on the structure and varying the number of the plurality of removable resilient conductors installed.

11. The system of claim 10:
    wherein the conductor is a metal clip that can be attached by engaging it with opposing bearing surfaces.

12. The system of claim 11:
    wherein the bearing surfaces are disposed on a flange fixed to the chassis and extending over a portion of one of the nodes.

13. The system of claim 11:
    further comprising a conductive arcuate surface to engage the clip.

14. The system of claim 10:
    wherein the controller determines whether the unique multi-digit binary number has been reported for each node in the system.

15. The system of claim 14:
    further comprising one communication bus per node in the system; and
    wherein the controller expects a specific node identification value to be reported on each of the communication buses.

* * * * *